(12) United States Patent
Cho et al.

(10) Patent No.: US 7,989,814 B2
(45) Date of Patent: Aug. 2, 2011

(54) THIN FILM TRANSISTOR ARRAY PANEL AND METHOD OF MANUFACTURING THE SAME

(75) Inventors: Young-Je Cho, Cheonan-si (KR); Byung-Duk Yang, Yongin-si (KR); Eun-Guk Lee, Seoul (KR); Sang-Yong No, Seoul (KR); Hyang-Shik Kong, Seongnam-si (KR); Sung-Hoon Kim, Seoul (KR); Su-Hyoung Kang, Bucheon-si (KR); Sung-Jae Moon, Seoul (KR); Sung-Wook Kang, Seoul (KR); Yeong-Beom Lee, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 12/420,958

(22) Filed: Apr. 9, 2009

(65) Prior Publication Data

US 2010/0038648 A1 Feb. 18, 2010

(30) Foreign Application Priority Data

Aug. 12, 2008 (KR) .................... 10-2008-0078802

(51) Int. Cl.
*H01L 33/00* (2010.01)
(52) U.S. Cl. ........ 257/72; 257/59; 257/88; 257/E33.053
(58) Field of Classification Search .................... 257/59, 257/72, 88, 258, E33.055, E33.053
See application file for complete search history.

*Primary Examiner* — Kiesha R Bryant
*Assistant Examiner* — Tucker Wright
(74) *Attorney, Agent, or Firm* — Cantor Colburn LLP

(57) ABSTRACT

A thin film transistor array panel including a substrate; a display area signal line; a display area thin film transistor; a peripheral area signal line; a black matrix disposed on the display area signal line, the display area thin film transistor, and the peripheral area signal line, the black matrix including a first and a second contact holes exposing the peripheral area signal line; a protrusion member disposed on the peripheral area signal line, the protrusion member overlapping the peripheral area signal line; a transparent connector disposed on the black matrix and within the peripheral area, wherein the transparent connector contacts the peripheral area signal line through at least one of the first and the second contact holes and includes a protrusion within at least one of the first and the second contact holes which corresponds to the protrusion member; and a pixel electrode.

18 Claims, 8 Drawing Sheets

THIN FILM TRANSISTOR ARRAY PANEL AND METHOD OF MANUFACTURING THE SAME

This application claims priority to Korean Patent Application No. 10-2008-0078802, filed on Aug. 12, 2008, and all the benefits accruing therefrom under 35 U.S.C. §119, the contents of which in its entirety are herein incorporated by reference.

BACKGROUND OF THE INVENTION (a) Field of the Invention

This disclosure relates to a thin film transistor array panel and a method of manufacturing the same.

(b) Description of the Related Art

A liquid crystal display is a widely used type of flat panel display. A liquid crystal display includes two display panels in which a liquid crystal layer is interposed between two field generating electrodes, such as a pixel electrode and a common electrode. The liquid crystal display generates an electric field in the liquid crystal layer by applying a voltage to the field generating electrodes, thereby selecting a direction of liquid crystal molecules of the liquid crystal layer, and displaying an image by controlling a polarization of incident light.

The liquid crystal display further includes a thin film transistor ("TFT"), which is connected to a pixel electrode, a plurality of signal lines for controlling the TFT, and a black matrix for preventing reflection of external light. The black matrix may be disposed on a TFT array panel in order to improve transmittance and simplify a manufacturing process. However, in the TFT array panel, because the black matrix does not cover a contact hole that is disposed in a peripheral area of the liquid crystal display, external light may be reflected through the contact hole, thereby deteriorating display quality of the liquid crystal display.

BRIEF SUMMARY OF THE INVENTION

The above described and other drawbacks are alleviated by a thin film transistor ("TFT") array panel including a substrate including a display area and a peripheral area; a display area signal line disposed in the display area; a display area thin film transistor disposed in the display area, the display area thin film transistor electrically connected to the display area signal line; a peripheral area signal line disposed in the peripheral area; a black matrix disposed on the display area signal line, the display area thin film transistor, and the peripheral area signal line, the black matrix including a first and a second contact holes exposing the peripheral area signal line; a protrusion member disposed on or under the peripheral area signal line, the protrusion member overlapping the peripheral area signal line; a transparent connector disposed on the black matrix and within the peripheral area, wherein the transparent connector contacts the peripheral area signal line through at least one of the first and the second contact holes and includes a protrusion within at least one of the first and the second contact holes which corresponds to the protrusion member; and a pixel electrode electrically connected to the display area thin film transistor.

The protrusion member may include at least one insulating layer.

The peripheral area signal line may include a gate layer line and a data layer line separated by a gate insulating layer, and the protrusion member may further includes a first metal layer disposed in a layer which is the same layer as that of the gate layer line.

The protrusion member may further include a second metal layer disposed in a layer which is the same layer as that of the data layer line.

The peripheral area signal line may include a gate layer line and a data layer line separated by a gate insulating layer, and the protrusion member includes a first metal layer disposed in a layer which is the same layer as a layer of the gate layer line.

The protrusion member may include a second metal layer disposed in a layer which is the same layer as a layer of the data layer line.

The second metal layer of the protrusion member may be electrically connected to the data layer line.

The first metal layer may be electrically connected to the gate layer line.

The protrusion member may include the black matrix.

The protrusion member may include a signal line member electrically connected to the peripheral area signal line.

The signal line member may have a width which is greater than a width of the black matrix in the protrusion member and a portion of an upper surface of the signal line member contacts the transparent connector.

The protrusion member may include at least one insulating layer.

The transparent connector may contact the side surface of the signal line member.

The protrusion member may include a plurality of recessed portions and a cross-sectional area of the recessed portion may be between about 4 square micrometers to about 100 square micrometers.

A gap of the recessed portion may be between about 2 micrometers to about 10 micrometers.

A tilt angle of the recessed portion may be between about 15 degrees to about 90 degrees.

A length of an axis which is horizontal relative to the tilt angle may be between about 1 micrometer to about 3 micrometers.

The peripheral area signal line may include a storage electrode line disposed on the substrate; and a storage voltage supply line disposed on the storage electrode line.

In an embodiment, a method of manufacturing a TFT array panel includes forming a display area signal line and a peripheral area signal line on a substrate; forming a black matrix on the peripheral area signal line, the black matrix including a plurality of contact holes which expose a surface of the peripheral area signal line; and forming a transparent connector to form a pixel electrode on the display area signal line, the transparent connector contacting the peripheral area signal line through the contact hole, wherein at least one of the forming of the peripheral area signal line and the forming of the black matrix includes forming a protrusion member at a position which is substantially the same as a position where the contact hole is disposed.

In an embodiment, the forming of the protrusion member includes forming a signal line member and the peripheral area signal line simultaneously.

In an embodiment, the forming of the protrusion member includes an exposure process which includes forming a halftone mask, a development process, and a wet etching process.

In an embodiment, the protrusion member includes the black matrix.

In an embodiment, the signal line member has a width which is greater than a width of the black matrix, and an upper surface of a portion of the signal line member contacts the transparent connector.

In an exemplary embodiment, at least one protrusion member is disposed on a contact hole disposed in a peripheral area of a liquid crystal display, when external light is applied to the contact hole, diffuse reflection occurs and thus a quality of the liquid crystal display is improved.

These and other features, aspects, and advantages of the disclosed embodiments will become better understood with reference to the following description and appended claims.

BRIEF DESCRIPTION OF THE DRAWINGS

The above and other aspects, advantages, and features of the invention will become more apparent by describing in further detail exemplary embodiments thereof with reference to the attached drawings, in which.

DETAILED DESCRIPTION OF THE INVENTION

Figure 1:
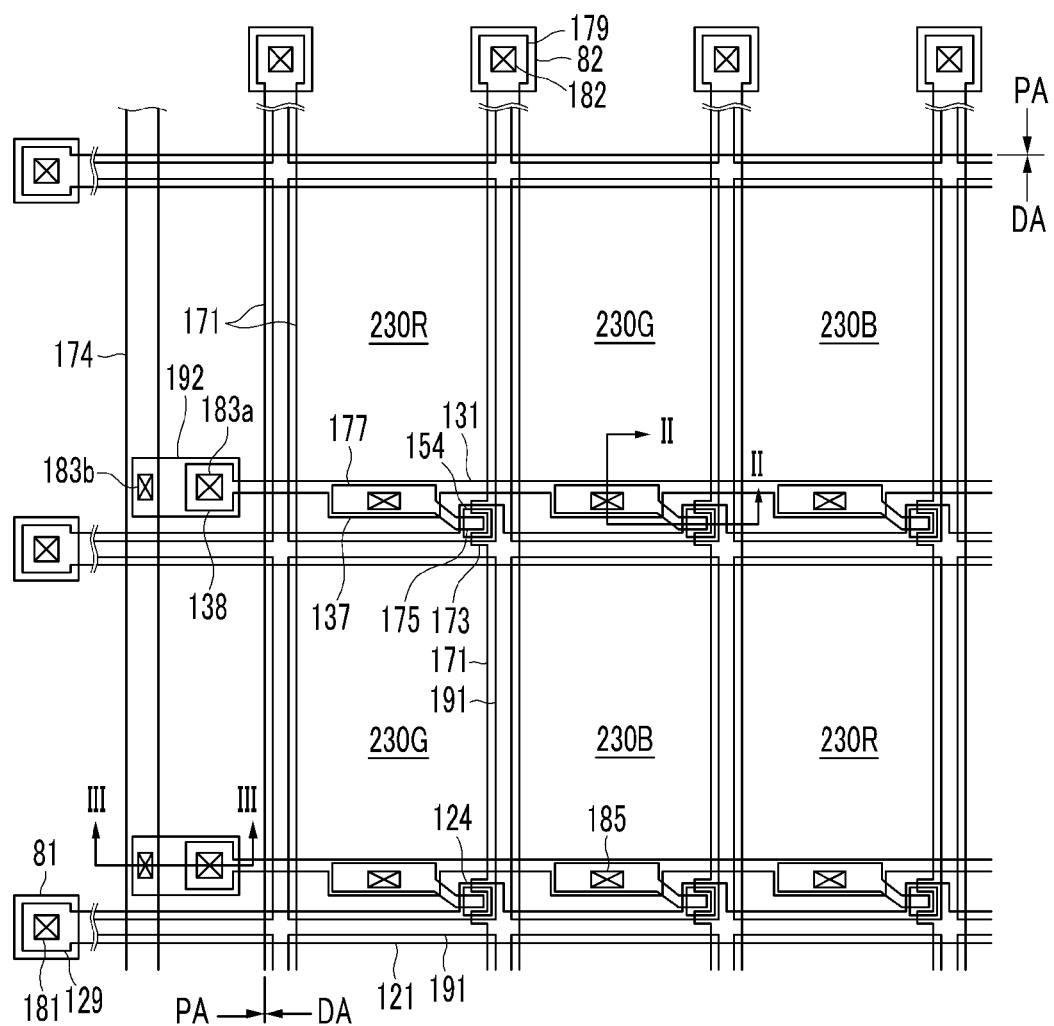
FIG. 1 is a plan view showing an exemplary embodiment of a liquid crystal display.

The invention will be described more fully hereinafter with reference to the accompanying drawings, in which exemplary embodiments are shown. As those skilled in the art would realize, the disclosed embodiments may be modified in various different ways, all without departing from the spirit or scope of the invention. Accordingly, the drawings and description are to be regarded as illustrative in nature and not restrictive. Like reference numerals designate like elements throughout the specification.

In the drawings, the thickness of layers, films, panels, regions, etc., may be exaggerated for clarity. It will be understood that when an element such as a layer, film, region, or substrate is referred to as being "on" another element, it may be directly on the other element or intervening elements may also be present. If any element is said to be positioned directly on another element, it means that there is no intermediate element between the two elements. In contrast, when an element such as a layer, film, region, or substrate is referred to as being "under" another element, it may be directly under the other element or intervening elements may also be present. If any element is said to be positioned directly under another element, it means that there is no intermediate element between the two elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

A liquid crystal display according to an exemplary embodiment is described in detail with reference to FIGS. 1 to 4.

Figure 2:
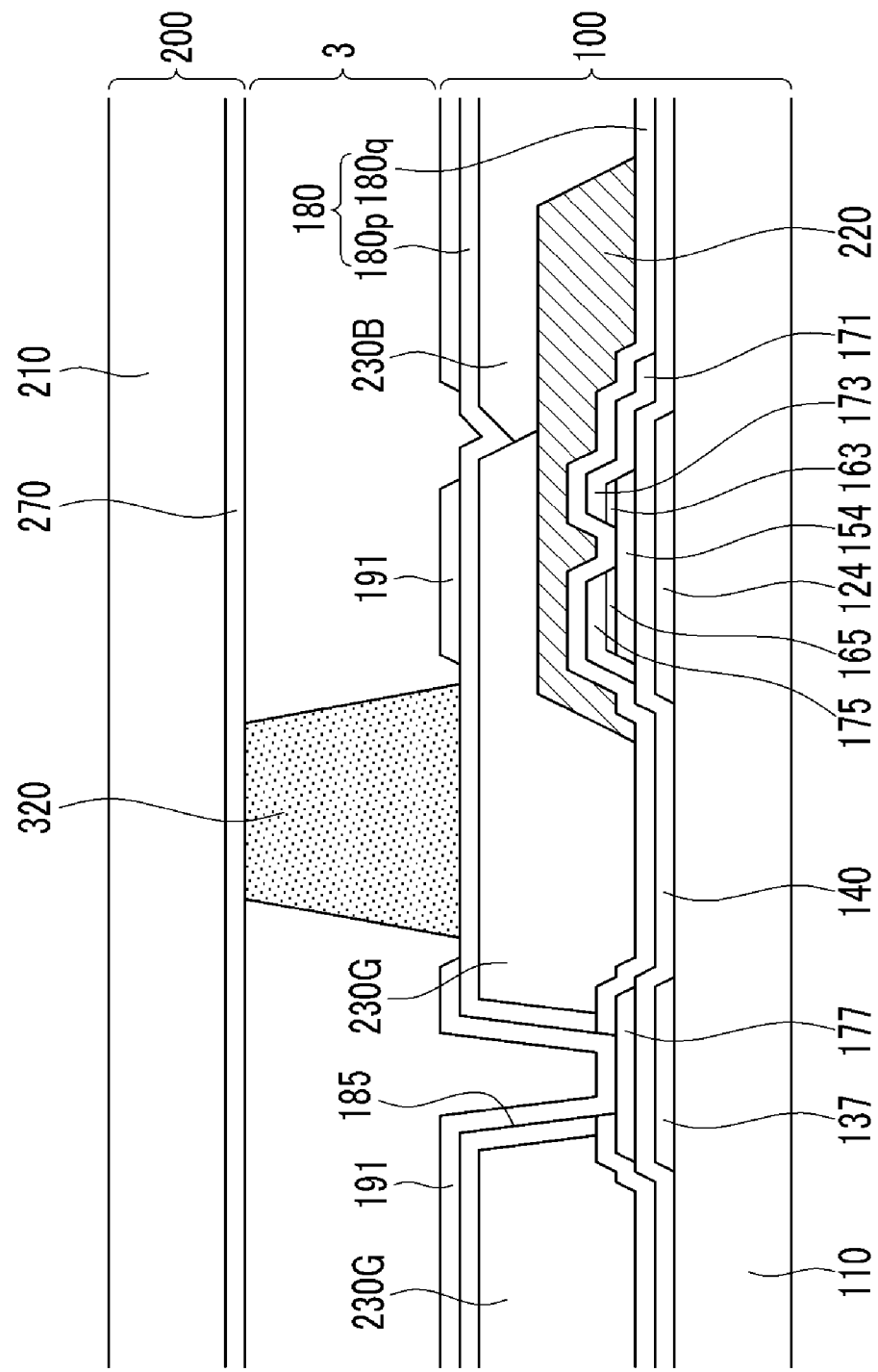
FIG. 2 is a cross-sectional view showing an exemplary embodiment of the liquid crystal display taken along line II-II of FIG. 1.
Figure 3:
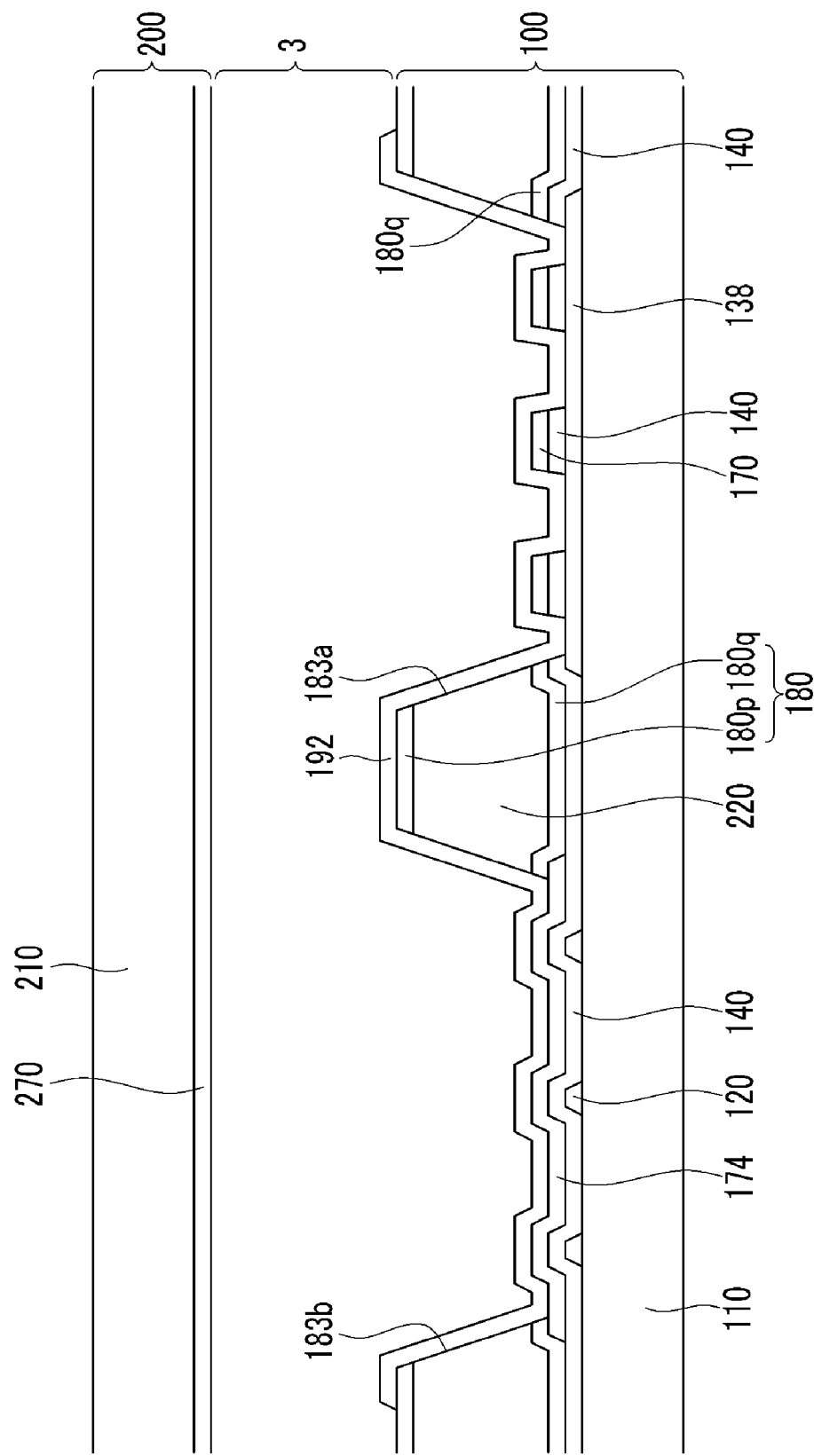
FIG. 3 is a cross-sectional view showing an exemplary embodiment of the liquid crystal display taken along line III-III of FIG. 1.
Figure 4:
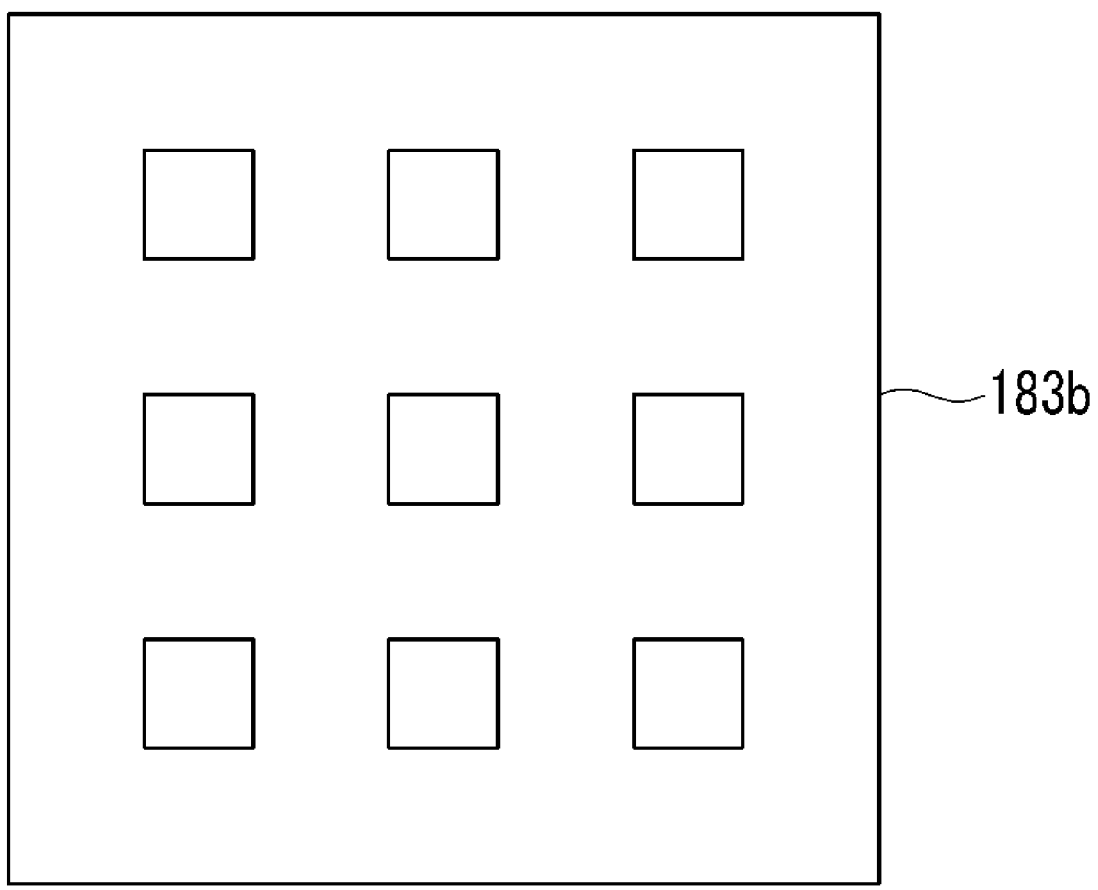
FIG. 4 is a plan view showing an exemplary embodiment of a contact hole which is shown in the cross-sectional view of FIG. 3.

FIG. 1 is a plan view showing an exemplary embodiment of a liquid crystal display, FIG. 2 is a cross-sectional view showing an exemplary embodiment of the liquid crystal display taken along line II-II of FIG. 1, FIG. 3 is a cross-sectional view showing an exemplary embodiment of the liquid crystal display taken along line III-III of FIG. 1, and FIG. 4 is a plan view showing an exemplary embodiment of a contact hole in the cross-sectional view of FIG. 3.

Referring to FIGS. 1 to 3, the liquid crystal display includes a first display panel 100, a second display panel 200, and a liquid crystal layer 3.

The liquid crystal layer 3 may have a positive dielectric anisotropy, and in a state where no electric field is applied, a major axis of a liquid crystal molecule of the liquid crystal layer 3 may be aligned almost horizontally, or horizontally, relative to a surface of the first or the second display panels 100 and 200.

An alignment layer (not shown) may be disposed on an inner surface of at least one of the first display panel 100 and the second display panel 200, and may be a horizontal alignment layer. A polarizer (not shown) may be disposed on an outer surface of at least one of the first display panel 100 and the second display panel 200.

A display panel comprises a signal line, which may comprise a gate line and a data line. The gate line may be disposed in a gate layer. A gate layer line is a line disposed in a layer which is the same as a layer of the gate line, and may be a gate line or a storage voltage line, for example. A data line may be disposed in a data layer. A data layer line is a line disposed in a layer which is the same as a layer of the data line, and may be a data line or a data metal layer, for example. The signal line may comprise a signal line member, such as a storage electrode, an outer storage electrode, or the like.

A display area DA of the liquid crystal display is a region where an image may be displayed, and a peripheral area PA is a region around the display area DA, which may comprise wiring, such as a peripheral area signal line, disposed therein. A display area signal line is a signal line disposed within a display area, and a peripheral area signal line is a signal line disposed within a peripheral area.

First, the first display panel 100 is described.

A gate line 121 and a storage electrode line 131 are disposed on a first insulating substrate 110, which may comprise transparent glass, plastic, or the like, or a combination comprising at least one of the foregoing materials.

The gate line 121 transfers a gate signals, and may extend in a horizontal direction. Each gate line 121 may include a plurality of gate electrodes 124, which may protrude in an upward direction.

The storage electrode line 131 may receive a selected voltage and may extend in a direction which is substantially parallel to a direction of the gate line 121. The storage electrode line 131 may be disposed adjacent to the gate line 121, which may be disposed on a lower side of a pixel area. Each storage electrode line 131 includes a primary storage electrode 137 and a secondary storage electrode (not shown), which may comprise a rectilinear shape. In an embodiment, the storage electrode line 131 may comprise a non-rectilinear shape or a spherical shape.

A gate insulating layer 140, which may comprise silicon nitride, $SiN_x$, silicon oxide, $SiO_x$, or the like, or a combination comprising at least one of the foregoing materials, is disposed on the gate line 121 and the storage electrode line 131.

A semiconductor island 154, which may comprise hydrogenated amorphous silicon, ("a-Si"), polysilicon, or the like, or a combination comprising at least one of the foregoing materials, is disposed on the gate insulating layer 140. The semiconductor island 154 may be disposed on the gate electrode 124.

A first and a second ohmic contacts 163 and 165 are disposed on the semiconductor island 154. The first and the second ohmic contacts 163 and 165 may comprise n+ hydrogenated amorphous silicon, in which an n-type impurity such as phosphorus is doped at a high concentration, silicide, or the like, or a combination comprising at least one of the foregoing materials.

A data line 171 and a drain electrode 175 are disposed on the first and the second ohmic contacts 163 and 165 and the gate insulating layer 140.

The data line 171 transfers a data voltage and may extend in a vertical direction which is perpendicular the gate lines 121. Each data line 171 may be disposed substantially parallel to a secondary storage electrode (not shown), and may be disposed adjacent to a gate electrode 124. The data line 171 includes a source electrode 173, which may comprise a "U" shape, which is configured in a direction towards a side of the gate electrode 124. In an embodiment, the source electrode 173 may comprise a shape other than a "U" shape.

The drain electrode 175 may be separated from the data line 171 and may include a narrow portion and a wide portion 177. The narrow portion may include an end part, which is partially surrounded by the source electrode 173, and the wide portion 177 may be disposed to have a substantially rectilinear shape, which may overlap the primary storage electrode 137. The wide portion 177 of the drain electrode 175 may have an area, which is smaller than an area of the primary storage electrode 137.

A TFT comprises the gate electrode 124, the source electrode 173, the drain electrode 175, and the semiconductor island 154, and a channel of the TFT is disposed on the semiconductor island 154 between the source electrode 173 and the drain electrode 175. A display area TFT is a TFT disposed in the display area. A display area TFT may be electrically connected to a display area signal line.

The first and the second ohmic contacts 163 and 165 may be disposed between the semiconductor island 154 and the data line 171 and drain electrode 175, to reduce a contact resistance therebetween. An exposed portion, which is not covered by the data line 171 and the drain electrode 175, and a portion between the source electrode 173 and the drain electrode 175, may be disposed on the semiconductor 154.

A passivation layer 180 is disposed on the data line 171, the drain electrode 175, and an exposed portion of the semiconductor island 154. The passivation layer 180 includes an upper layer 180*p* and a lower layer 180*q*, which may comprise an inorganic insulator, such as silicon nitride, silicon oxide, or the like, or a combination comprising at least one of the foregoing materials. In an embodiment, the upper layer 180*p* may comprise an organic insulator, and the upper layer 180*p* may have a thickness, which is greater than a thickness of the lower layer 180*q*. In an embodiment, one of the upper layer 180*p* and the lower layer 180*q* may be omitted. A first contact hole 185, which exposes the wide portion 177 of the drain electrode 175, may be disposed in the passivation layer 180.

A black matrix 220 is disposed between the upper layer 180*p* and the lower layer 180*q*. The black matrix 220 may reduce or effectively prevent passage of light, or reflection of external light, through a region which may not control the liquid crystal molecule of the liquid crystal layer 3. In an embodiment, disposing the black matrix 220 on the first display panel 100, rather than on the second display panel 200, has been observed to improve transmittance of the liquid crystal display and simplify a manufacturing process.

A red color filter 230R, a green color filter 230G, and a blue color filter 230B may be disposed between the upper layer 180*p* and the lower layer 180*q*. The red color filter 230R may occupy a region between adjacent data lines 171. A lateral border of the red color filter 230R may be disposed on the data line 171, and may extend in a vertical direction along the data line 171. Thus, in an embodiment, the red color filter 230R may be disposed in a striped shape. The first contact hole 185, which is disposed on the wide portion 177 of the drain electrode 17, may be disposed in the red color filter 230R. The red color filter 230R may comprise a photosensitive organic material, a red pigment, or the like, or a combination comprising at least one of the foregoing materials. In an embodiment, the red color filter 230R may be disposed on the second display panel 200, rather than the first display panel 100. The above description of the red color filter 230R may be similarly applied to a green color filter 230G, and a blue color filter 230B.

A pixel electrode 191 is disposed on the upper layer 180*p* of the passivation layer 180. The pixel electrode 191 may comprise a transparent conductive material, such as indium tin oxide ("ITO"), indium zinc oxide ("IZO"), or the like, or a combination comprising at least one of the foregoing transparent conductive materials. In an embodiment where the color filters 230R, 230G, and 230B are disposed on the second display panel 200, the pixel electrode 191 may comprise a transparent conductive material, or a reflective metal, such as aluminum, silver, chromium, an alloy thereof, or the like, or a combination comprising at least one of the foregoing transparent conductive materials and reflective metals.

The pixel electrode 191 is electrically connected to the drain electrode 175 of the TFT through the first contact hole 185, and receives a data voltage from the drain electrode 175. The pixel electrode 191, to which a data voltage is applied, and a common electrode 270 of the second display panel 200 generate an electric field, thereby selecting a direction of a liquid crystal molecule of the liquid crystal layer 3, which is interposed between the pixel electrode 191 and the common electrode 270. A luminance of light passing through the liquid crystal layer 3 may be controlled by the selected direction of the liquid crystal molecule.

Because the pixel electrode 191 and the common electrode 270 form a liquid crystal capacitor, the pixel electrode 191 and the common electrode 270 may sustain an applied voltage after the TFT is turned off.

The pixel electrode 191 and the drain electrode 175, which is connected thereto, form a storage capacitor by overlapping with the storage electrode line 131, which includes the primary storage electrode 137 and a secondary storage electrode (not shown).

A spacer 320, which may comprise an organic material, for example, is disposed in the display area DA of the liquid crystal display. In an embodiment, the spacer 320 may sustain a gap between the first display panel 100 and the second display panel 200.

A storage voltage supply line 174 may be disposed in the same layer as the data line 171 and in the peripheral area PA of the liquid crystal display, and may extend in a direction which is substantially vertical. The storage voltage supply line 174 receives a storage voltage, which is supplied to the storage electrode line. The storage voltage supply line 174 is electrically connected to the storage electrode line 131 and a transparent connector 192. In an embodiment, a second and a third contact holes 183a and 183b are disposed in a connection portion of the storage electrode line 131 and a connection portion of transparent connector 192, and a protrusion member is disposed on a bottom surface of at least one of the second and the third contact holes 183a and 183b. In an embodiment, a plurality of protrusion members are disposed on the bottom surface of at least one of the second and the third contact holes. Therefore, when an external light is disposed on the second and the third contact holes 183a and 183b, which are disposed in the peripheral area PA, diffuse reflection occurs due to the protrusion member, and thus the external light is not observable. In addition, an electrical resistance of an area where the storage voltage supply line 174 and the storage electrode line 131 contact the transparent connector 192, may be a sufficient value for applying a storage voltage.

With reference to FIG. 3, a stacking structure of a contact portion of the storage voltage supply line 174 and the transparent connector 192 is further described. Because a gate metal layer 120, which includes an opening, is disposed on the first substrate 110 to have a substantially uniform thickness, the first substrate 110 may be exposed through the opening. In an embodiment, the gate metal layer 120 is electrically isolated. The gate insulating layer 140 is disposed to have a substantially uniform thickness and may be disposed on the gate metal layer 120. The storage voltage supply line 174 may have a substantially uniform thickness and be disposed on the gate insulating layer 140. The transparent connector 192 is disposed on the storage voltage supply line 174 and may have a substantially uniform thickness, and the transparent connector 192 and the storage voltage supply line 174 may be electrically connected. Finally, a surface of the transparent connector 192 is disposed, the surface comprising a protrusion and a depression. In an embodiment, the surface comprises a plurality of protrusions and depressions.

Referring to FIG. 3, a stacking structure of a contact portion of the transparent connector 192 and an outer storage electrode 138, which is an end portion of the storage electrode line 131, is further described. The outer storage electrode 138 is disposed on the first substrate 110 and may have a substantially uniform thickness. Because the gate insulating layer 140, which includes an opening disposed on the outer storage electrode 138 and may have a substantially uniform thickness, the outer storage electrode 138 is exposed through the opening. A data metal layer 170 may include an opening having a size which is substantially the same as a size of the opening of the gate insulating layer, may be disposed at a position which is substantially the same as a position of the opening of the gate insulating layer 140, may have a thickness which is substantially uniform, and may be disposed on the gate insulating layer 140. Therefore, the outer storage electrode 138 may be exposed through the opening of the gate insulating layer 140 and the data metal layer 170. The transparent connector 192 may be disposed on the data metal layer 170, may have a substantially uniform thickness, and the data metal layer 170 may be electrically connected to only the transparent connector 192. In an embodiment, a portion of an upper surface of the outer storage electrode 138 contacts the transparent connector 192. Finally, a surface of the transparent connector 192 may comprise a protrusion and a depression. In an embodiment, transparent connector 192 may comprise a plurality of protrusions and depressions.

In FIG. 4, the square shape represents a recessed portion, and a portion between squares represents a raised portion. A width and a length of the recessed portion, which is disposed in the third contact hole 183b, may independently be between about 3 μm to about 5 μm, and a gap of the recessed portion may be between about 3 μm to about 5 μm, a tilt angle of the recessed portion may be between about 15 degrees (°) to about 90°, and a length of a horizontal axis relative to a tilt angle of the recessed portion may be between about 1 μm to about 3 μm, and when the recessed portion is disposed having these dimensions, diffusion of a reflection of an external light is further improved. In an exemplary embodiment, the recessed portion may have a cross-sectional area between about 4 μm² to about 100 μm². In an exemplary embodiment, when a tilt angle of the recessed portion is about 36°, diffusion of a reflection of an external light is observed to improve by greater than about 20 percent (%). In addition, in another exemplary embodiment, when a length of a horizontal axis relative to a tilt angle of the recessed portion is about 1.25 μm, diffusion of a reflection of an external light is improved by more than about 20%, and when the length of the horizontal axis relative to a tilt angle of the recessed portion is about 2 μm diffusion of a reflection of an external light is observed to improve by more than about 35%. The size, shape, disposition, and quantity of the recessed portion are not limited to the exemplary embodiment of FIG. 4, and various other configurations may be selected. In another embodiment, the exemplary embodiment of FIG. 4 may be similarly applied to another contact hole, such as the second contact hole 183a.

Next, the second display panel 200 is further described.

A common electrode 270 is disposed on a second insulating substrate 210, which comprises transparent glass, plastic, or the like, or a combination comprising at least one of the foregoing materials. The common electrode 270 may comprise a transparent conductor, such as ITO, IZO, or the like, or a combination comprising at least one of the foregoing transparent conductors, and receives a common voltage.

An alignment layer may be disposed on the common electrode 270.

Figure 5:
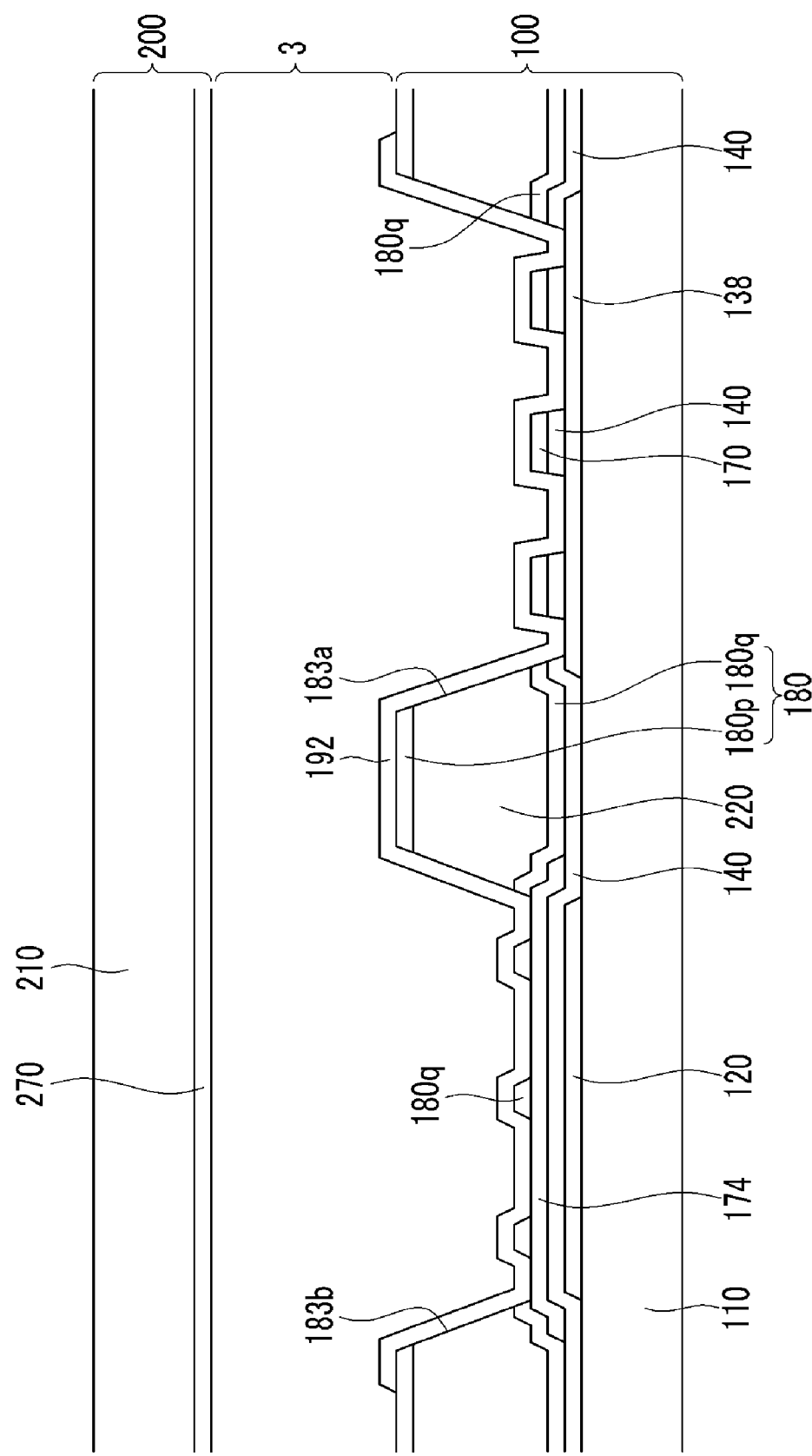
FIG. 5 is a cross-sectional view showing another exemplary embodiment of a liquid crystal display.

FIG. 5 is a cross-sectional view of a liquid crystal display according to another exemplary embodiment. The exemplary embodiment of FIG. 5 is similar to the exemplary embodiment of FIGS. 1 to 4, except that a stacking structure of a contact portion of the storage voltage supply line 174 and the transparent connector 192 is different.

Referring to FIG. 5, described is the stacking structure of a contact portion of the storage voltage supply line 174 and the transparent connector 192. The gate metal layer 120, which may have a substantially uniform thickness, is disposed on the first substrate 110, and the gate metal layer 120 may be electrically isolated. The gate insulating layer 140 is disposed on the gate metal layer 120 and may have a substantially uniform thickness. The storage voltage supply line 174 is disposed on the gate insulating layer 140 and may have a substantially uniform thickness. Because a lower layer 180q, which may include an opening, is disposed on the storage voltage supply line 174 and may have a substantially uniform thickness, the storage voltage supply line 174 is exposed through the opening. The transparent connector 192 is disposed on the lower layer 180q and may have a substantially uniform thickness. Therefore, the storage voltage supply line 174, and the transparent connector 192, may be electrically connected through the opening of the lower layer 180q. Finally, a surface of the transparent connector 192 is disposed with a protrusion and a depression. In an embodiment the surface of the transparent connector 192 may comprise a plurality of protrusions and depressions.

Figure 6:
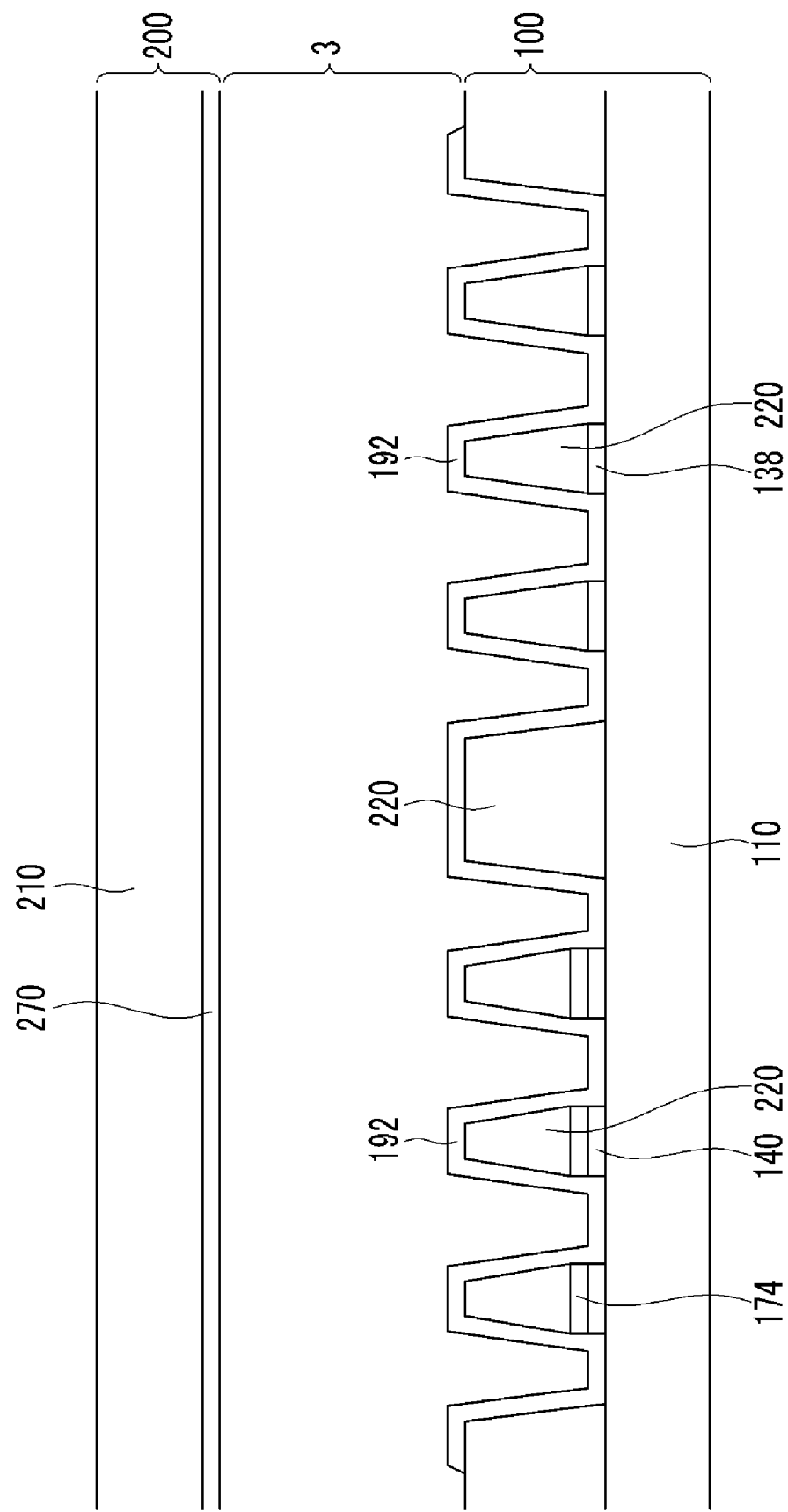
FIG. 6 is a cross-sectional view showing another exemplary embodiment of a liquid crystal display.

FIG. 6 is a cross-sectional view of a liquid crystal display according to another exemplary embodiment.

The exemplary embodiment of FIG. 6 is similar to the exemplary embodiment of FIGS. 1 to 4, except that a stacking structure of a contact portion of the storage voltage supply line 174 and the transparent connector 192, and a stacking structure of a contact portion of the outer storage electrode 138 and the transparent connector 192 are different.

In the exemplary embodiment of FIG. 6, because an area occupied by the black matrix 220 is larger than an area occupied by the black matrix 220 in the exemplary embodiment of FIGS. 1 to 4, a diffused reflection effect by a recessed portion is obtained, a light blocking effect by a black matrix is obtained, and thus a greater fraction of a reflection of an external light is blocked. In addition, an electrical resistance of an area where the storage voltage supply line 174 and the outer storage electrode 138 contact the transparent connector 192 may be sufficient for applying a storage voltage. Further, light from a light source (not shown) may pass through a contact portion of the transparent connector 192 and the first substrate 110, and when a voltage is not applied between a pixel electrode and a common electrode, a liquid crystal may be vertically aligned in a vertical alignment mode, thus the passed light may be blocked by a polarizer (not shown), which may be disposed on an outer surface of the second substrate 210, and thus light leakage may be reduced or substantially eliminated.

The size, shape, configuration, and quantity of a recessed portion are not limited to the exemplary embodiment of FIG. 6, and may be variously selected.

Referring to FIG. 6, described is a stacking structure of a contact portion of the storage voltage supply line 174 and the transparent connector 192. Because the gate insulating layer 140, which includes an opening, is disposed on the first substrate 110 and may have a substantially uniform thickness, the first substrate 110 is exposed through the opening. The storage voltage supply line 174 includes an opening having a size which is substantially the same as a size of the opening of the gate insulating layer 140, is disposed at a position which is substantially the same as a position of the opening of the gate insulating layer 140, is disposed to have a substantially uniform thickness, and may be disposed on the gate insulating layer 140. Similarly, the black matrix 220 includes an opening having a size which is substantially the same as a size of the opening of the storage voltage supply line 174, may be disposed at a position which is substantially the same as a position of the opening of the storage voltage supply line 174, may be disposed to have a substantially uniform thickness, and may be disposed on the storage voltage supply line 174. The transparent connector 192 may be disposed to have a substantially uniform thickness and may be disposed on the black matrix 220. Therefore, a side surface of the storage voltage supply line 174 and the transparent connector 192 are electrically connected through an opening of the gate insulating layer 140, the storage voltage supply line 174, and the black matrix 220. Finally, a surface of the transparent connector 192 is disposed to comprise a protrusion and a depression. In an embodiment, the transparent connector 192 comprises a plurality of protrusions and depressions.

Referring to FIG. 6, described is a stacking structure of a contact portion of the storage voltage supply line 174 and the transparent connector 192. Because the outer storage electrode 138, which includes an opening, is disposed on the first substrate 110 and may have a substantially uniform thickness, the first substrate 110 is exposed through the opening. The black matrix 220 includes an opening having a size which is substantially the same as a size of an opening of the outer storage electrode 138, is disposed at a position which is substantially the same as a position of the opening of the outer storage electrode 138, is disposed on the outer storage electrode 138, and may have a substantially uniform thickness. The transparent connector 192 may be disposed on the black matrix 220 and may have a substantially uniform thickness. Therefore, a side surface of the outer storage electrode 138 and the transparent connector 192 may be electrically connected through the opening of the outer storage electrode 138 and the black matrix 220. Finally, a surface of the transparent connector 192 is disposed with a protrusion and a depression. In an embodiment, a surface of the transparent connector 192 comprises a plurality of protrusions and depressions.

Figure 7:
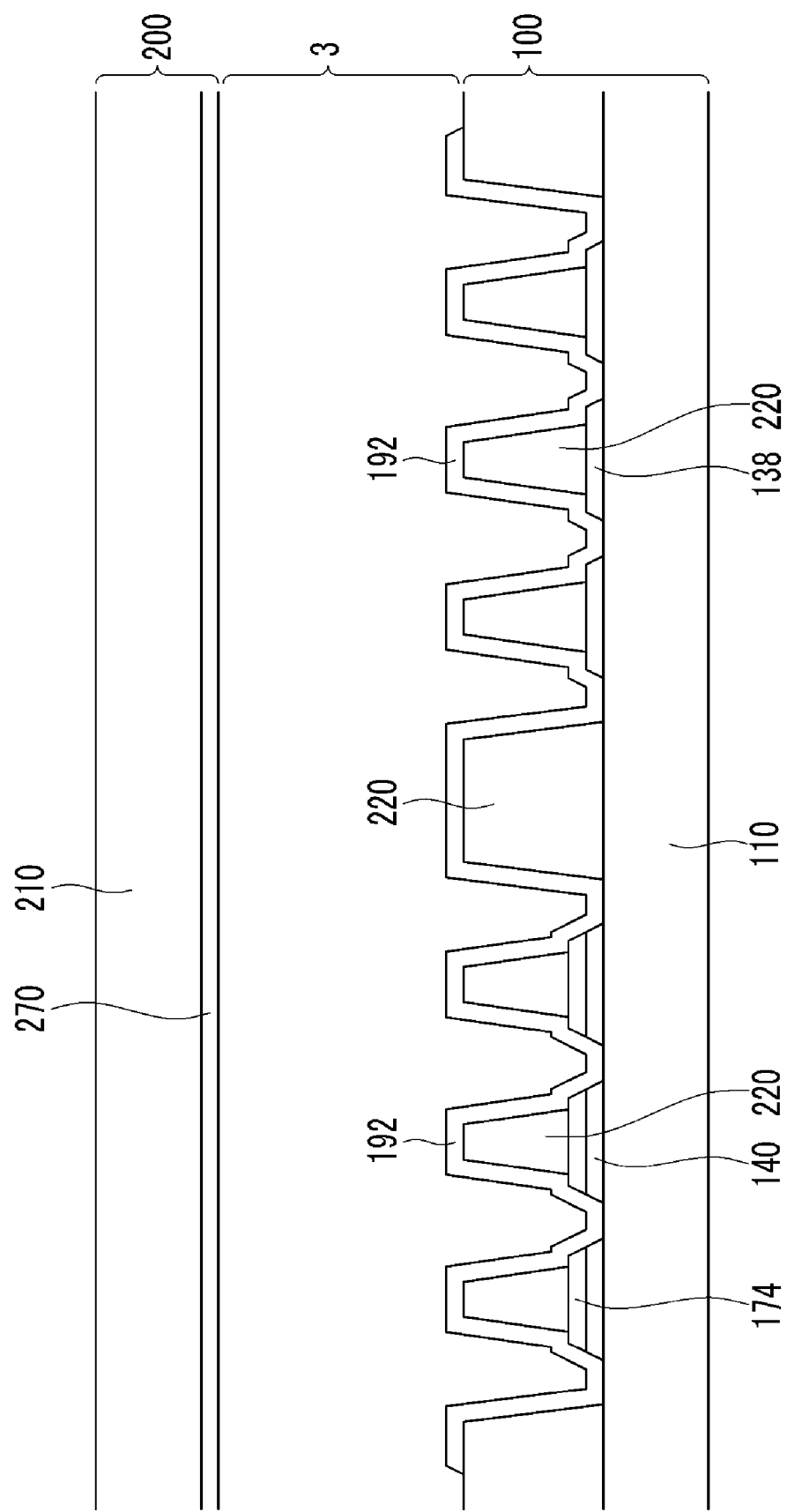
FIG. 7 is a cross-sectional view showing another exemplary embodiment of a liquid crystal display.
Figure 8:
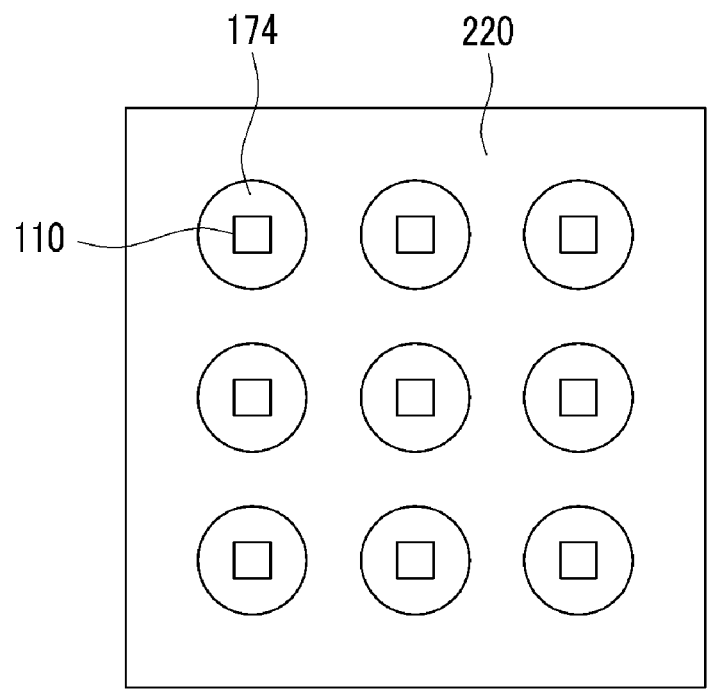
FIG. 8 is a plan view showing an exemplary embodiment of a contact hole which is shown in the cross-sectional view of FIG. 7.

FIG. 7 is a cross-sectional view of a liquid crystal display according to another exemplary embodiment, and FIG. 8 is a plan view of a contact hole in the cross-sectional view of FIG. 7.

The exemplary embodiment of FIGS. 7 and 8 is similar to the exemplary embodiment of FIG. 6, except that the storage voltage supply line 174 and the outer storage electrode 138 form a step with the black matrix 220. Accordingly, in the exemplary embodiment of FIGS. 7 and 8, an area where the storage voltage supply line 174 and the outer storage electrode 138 contact the transparent connector 192 may be increased relative to the embodiment of FIG. 6.

Figure 9:
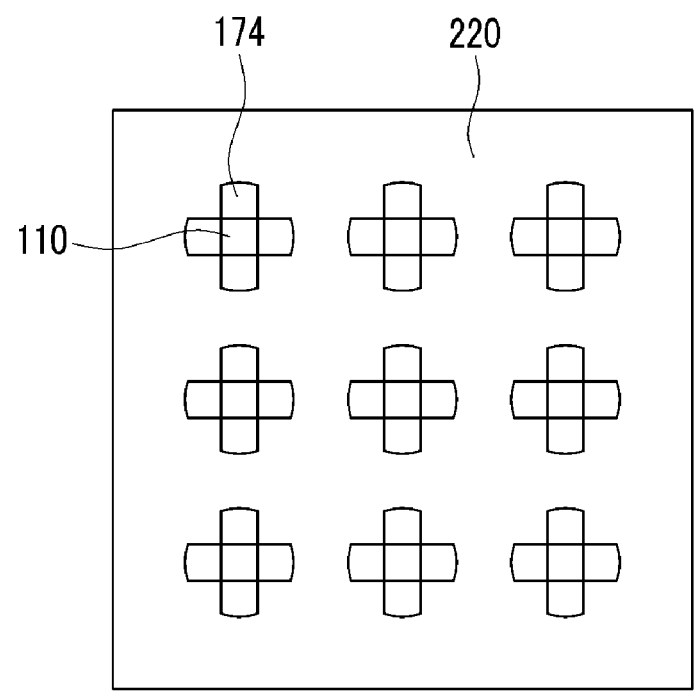
FIG. 9 is a plan view showing another exemplary embodiment of a contact hole of a liquid crystal display.

FIG. 9 is a plan view of a contact hole of a liquid crystal display according to another exemplary embodiment.

The exemplary embodiment of FIG. 9 is similar to the exemplary embodiment of FIGS. 7 and 8, except that the black matrix 220 further blocks a part of the storage electrode supply line 174. Accordingly, in the exemplary embodiment of FIG. 9, because a width of an area of the black matrix 220 may be greater than a width of an area of black matrix 220 of the exemplary embodiment of FIGS. 7 and 8, blocking of a reflection of external light by the black matrix may be further improved in the exemplary embodiment of FIG. 9.

Further, in a peripheral area PA of the liquid crystal display, in addition to the second and the third contact holes 183a and 183b, which are disposed in a portion in which the storage voltage supply line 174 and the outer storage electrode 138 are connected to the transparent connector 192, another contact hole may be disposed. Thus, in an embodiment, if wiring (not shown) of the same layer as that of the gate line 121 and wiring of the same layer as that of the data line 171 are connected to a transparent connector (not shown) through a contact hole (not shown) in the peripheral area PA, the transparent connector within the contact hole may comprise a protrusion and a depression, as in the exemplary embodiment of FIGS. 1 to 9. In an embodiment, the transparent connector may comprise a plurality of protrusions and a plurality of depressions.

For example, signal lines of different layers, among signal lines (not shown) of the gate driver, may be electrically connected to a transparent connector (not shown) in a contact hole (not shown). Further, by distributing static electricity generated in the first display panel 100 to the entire first display panel 100, a plurality of TFTs (not shown), the data line 171, and a shorting line (not shown), may be electrically connected to a transparent connector (not shown) through a contact hole (not shown) to reduce or effectively prevent damage of an element, such as a TFT, by static electricity.

A method of manufacturing a TFT array panel according to an exemplary embodiment is further described hereinafter.

First, a method of manufacturing a display area DA is described.

A display area signal line and a peripheral area signal line are formed on a substrate. Thus the gate line 121 and the gate electrode 124 are formed on the first substrate 110. In an embodiment, after disposing a material of the gate line 121 on the first substrate 110, an exposure process is performed through a mask, which may be a half-tone mask, the mask includes a transmission region, a non-transmission region, and a transflective region, and a development process is performed with an organic solvent. In an embodiment, by narrowing a width of a slit that defines a transflective area, resolution may be deteriorated, reducing a thickness of the gate line 121, and thus both sides of the gate line 121 may comprise a tilt angle. Thereafter, an etching process is performed, and by wet etching, a tilt angle of either or both sides of the gate line 121 may be selected. Elements that are described hereinafter may be formed by a method, which is similar to the above-described method. However, when an organic film including a photosensitive material is formed, an etching process may be omitted.

A gate insulating layer 140 may be formed on the gate line 121 and the gate electrode 124. A semiconductor 154 may be formed on the gate insulating layer 140. A first and a second ohmic contacts 163 and 165 may be formed on the semiconductor 154. A data line 171, a source electrode 173, and a drain electrode 175 may be formed on the first and the second ohmic contacts 163 and 165.

A lower layer 180q may be formed on the source electrode 173 and the drain electrode 175. A black matrix 220 may be formed on the lower layer 180q. Each of a red color filter 230R, a green color filter 230G, and a blue color filter 230B may be formed on the black matrix 220. In an embodiment, the color filters 230R, 230G, and 230B are not formed on the first substrate 110.

An upper layer 180p may be formed on the color filters 230R, 230G, and 230B. A spacer 320 may be formed on the upper layer 180p. In an embodiment, the spacer 320 is not formed on the first substrate 110. A pixel electrode 191 may be formed on the upper layer 180p.

A liquid crystal layer 3 may be formed on the pixel electrode 191. In an embodiment, the liquid crystal layer 3 is not formed on the first substrate 110.

Next, a method of manufacturing the second and the third contact holes 183a and 183b of the peripheral area PA is further described.

A method of forming a contact portion of the storage voltage supply line 174 and the transparent connector 192 according to the exemplary embodiment of FIG. 3 is further described. After forming the gate metal layer 120 on the first substrate 110, an opening is formed by a photolithographic process. The gate insulating layer 140 may be formed on the gate metal layer 120. The storage voltage supply line 174 may be formed on the gate insulating layer 140 by a deposition process and a photolithographic process. After forming the lower layer 180q on the storage voltage supply line 174, by forming an opening by a photolithographic process, the storage voltage supply line 174 is exposed. The black matrix 220 may be formed on at least one of a display area signal line and a peripheral area signal line. Thus, in an embodiment, after forming the black matrix 220 on the exposed storage voltage supply line 174, by forming an opening by an exposure process and development process, the storage voltage supply line 174 is again exposed. Similarly, after forming the upper layer 180p, an opening is formed in the upper layer 180p by a photolithographic process. Further, by forming the transparent connector 192 by a deposition process and a photolithographic process, the storage voltage supply line 174 and the transparent connector 192 may be electrically connected.

A method of forming a contact portion of the transparent connector 192 and the outer storage electrode 138, which is an end portion of the storage electrode line 131 according to the exemplary embodiment of FIG. 3, is further described. The outer storage electrode 138 is formed on the first substrate 110 by a deposition process and a photolithographic process. The gate insulating layer 140 is formed on the outer storage electrode 138. After forming the data metal layer 170 on the gate insulating layer 140, an opening is formed by a photolithographic process. After forming the lower layer 180q on the data metal layer 170, if a photolithographic process which disposes an opening is performed, a portion of the gate insulating layer 140, which is exposed through an opening of the data metal layer 170, may be removed and thus an opening formed in the gate insulating layer 140. After forming the black matrix 220 on the data metal layer 170, by forming an opening by an exposure process and a development process, the data metal layer 170 and the outer storage electrode 138 are exposed. Similarly, after forming the upper layer 180p, by forming an opening by a photolithographic process, the data metal layer 170 and the outer storage electrode 138 are again exposed. Further, by forming the transparent connector 192 by a deposition process and a photolithographic process, the outer storage electrode 138 and the transparent connector 192 may be electrically connected.

A method of forming a contact portion according to the exemplary embodiment of FIG. 5 is similar to the method of forming a contact portion according to the exemplary embodiment of FIG. 3, except that a method of forming a contact portion of the storage voltage supply line 174 and the transparent connector 192 is different.

A method of forming a contact portion of the storage voltage supply line 174 and the transparent connector 192 according to the exemplary embodiment of FIG. 5 is further described. The gate metal layer 120 may be formed on the first substrate 110 by a deposition process and photolithographic process. The gate insulating layer 140 may be formed on the gate metal layer 120. The storage voltage supply line 174 may be formed on the gate insulating layer 140 by a deposition process and a photolithographic process. After forming a lower layer 180q on the storage voltage supply line 174, by forming an opening by a photolithographic process, the storage voltage supply line 174 is exposed through the opening. After forming the black matrix 220 on the lower layer 180q, by forming an opening in the black matrix 220 by an exposure process and a development processes, the lower layer 180q and the storage voltage supply line 174 are exposed. Similarly, after forming the upper layer 180p, by forming an opening in the upper layer 180p by a photolithographic process, the lower layer 180q and the storage voltage supply line 174 are again exposed. Further, by forming the transparent connector 192 by a deposition process and photolithographic process, the storage voltage supply line 174 and the transparent connector 192 may be electrically connected.

A method of forming a contact portion according to the exemplary embodiment of FIG. 6 is further described.

A method of forming a contact portion of the storage voltage supply line 174 and the transparent connector 192, according to the exemplary embodiment of FIG. 6, is further described. After forming the gate metal layer 120 on the first substrate 110, by forming an opening by a photolithographic process, the first substrate 110 is exposed. The gate insulating layer 140 is formed on the first substrate 110. After forming the storage voltage supply line 174 on the gate insulating layer 140, an opening is formed by a photolithographic process. After forming a lower layer 180q on the storage voltage supply line 174, by forming an opening in the lower layer 180q so that both the storage voltage supply line 174 and an opening thereof are exposed by a photolithographic process, the gate insulating layer 140, which is exposed through the opening of the storage voltage supply line 174, is also removed. Therefore, in the gate insulating layer 140 and the storage voltage supply line 174 an opening is formed at substantially the same position, and the first substrate 110 is exposed through the opening. After forming the black matrix 220, an opening of the black matrix 220 is formed at a position which is the same as a position of an opening of the storage voltage supply line 174 by an exposure process and a development process. After forming the upper layer 180p, an opening, which exposes both the black matrix 220 and the first substrate 110, is formed by a photolithographic process. Further, by forming the transparent connector 192 by a deposition process and a photolithographic process, the storage voltage supply line 174 and the transparent connector 192 may be electrically connected.

A method of forming a contact portion of the outer storage electrode 138 and the transparent connector 192, according to the exemplary embodiment of FIG. 6, is further described. After forming the outer storage electrode 138 on the first substrate 110, an opening is formed by a photolithographic process. A gate insulating layer 140 is formed on the outer storage electrode 138. After forming the data metal layer 170 on the gate insulating layer 140, an opening is formed by a photolithographic process, and the gate insulating layer 140 is exposed. After forming the lower layer 180q on the gate insulating layer 140, by forming an opening in the lower layer 180q by a photolithographic process, an opening is simultaneously formed in the gate insulating layer 140, and both the outer storage electrode 138 and the opening are exposed. After forming the black matrix 220 on the outer storage electrode 138, an opening is formed in the black matrix 220 so that an opening is formed at a position, which is the same as a position of the outer storage electrode 138, by an exposure process and a development process. Similarly, after forming the upper layer 180p, an opening is formed in the upper layer 180p so that the black matrix 220 and the first substrate 110 are exposed by a photolithographic process. Further, by forming the transparent connector 192 by a deposition process and a photolithographic process, the outer storage electrode 138 and the transparent connector 192 may be electrically connected.

A method of forming a contact portion according to an exemplary embodiment of FIGS. 7 and 8 is similar to the method of forming a contact portion according to the exemplary embodiment of FIG. 6, except that the storage voltage supply line 174 and the outer storage electrode 138 form a step with the black matrix 220. Therefore, in the exemplary embodiment of FIGS. 7 and 8, an exposure process and a development process may be performed by selecting a mask pattern so that a larger opening may be formed in the black matrix 220 than in the exemplary embodiment of FIG. 6.

A method of forming a contact portion, according to an exemplary embodiment of FIG. 9, is similar to the method of forming a contact portion according to the exemplary embodiment of FIGS. 7 and 8, except that a size of the opening in the black matrix 220 is smaller than a size of the opening in the black matrix 220 in the embodiment of FIGS. 7 or 8, and a shape of the opening thereof is different. Therefore, in the exemplary embodiment of FIG. 9, an exposure process and a development process are performed by selecting a mask pattern having a size which is smaller than a size of the opening in the black matrix 220 of the exemplary embodiment of FIGS. 7 or 8, and a shape of the opening in the black matrix 220 of the exemplary embodiment of FIG. 9 may be substantially similar to a shape of the opening in the black matrix 220 of the exemplary embodiment of FIGS. 7 and 8.

While the invention has been described in connection an exemplary embodiment, it is to be understood that the invention is not limited to the disclosed embodiments, but, on the contrary, is intended to include various modifications and equivalent arrangements included within the spirit and scope of the appended claims.

What is claimed is:

1. A thin film transistor array panel comprising:
a substrate comprising a display area and a peripheral area;
a display area signal line disposed in the display area;
a display area thin film transistor disposed in the display area, the display area thin film transistor electrically connected to the display area signal line;
a peripheral area signal line disposed in the peripheral area;
a black matrix disposed on the display area signal line, the display area thin film transistor, and the peripheral area signal line, the black matrix comprising a first and a second contact holes exposing the peripheral area signal line;
a protrusion member disposed on or under the peripheral area signal line, the protrusion member overlapping the peripheral area signal line;
a transparent connector disposed on the black matrix and within the peripheral area, wherein the transparent connector contacts the peripheral area signal line through at least one of the first and the second contact holes and comprises a protrusion within at least one of the first and the second contact holes which corresponds to the protrusion member; and
a pixel electrode electrically connected to the display area thin film transistor.

2. The thin film transistor array panel of claim 1, wherein the protrusion member comprises at least one insulating layer.

3. The thin film transistor array panel of claim 2, wherein the peripheral area signal line comprises a gate layer line and a data layer line separated by a gate insulating layer, and
the protrusion member comprises a first metal layer disposed in a layer which is the same layer as that of the gate layer line.

4. The thin film transistor array panel of claim 3, wherein the protrusion member comprises a second metal layer disposed in a layer which is the same layer as that of the data layer line.

5. The thin film transistor array panel of claim 1, wherein the peripheral area signal line comprises a gate layer line and a data layer line separated by a gate insulating layer, and
the protrusion member comprises a first metal layer disposed in a layer which is the same layer as a layer of the gate layer line.

6. The thin film transistor array panel of claim 5, wherein the protrusion member comprises a second metal layer disposed in a layer which is the same layer as a layer of the data layer line.

7. The thin film transistor array panel of claim 6, wherein the second metal layer of the protrusion member is electrically connected to the data layer line.

8. The thin film transistor array panel of claim 5, wherein the first metal layer is electrically connected to the gate layer line.

9. The thin film transistor array panel of claim 1, wherein the protrusion member comprises the black matrix.

10. The thin film transistor array panel of claim 9, wherein the protrusion member comprises a signal line member electrically connected to the peripheral area signal line.

11. The thin film transistor array panel of claim 10, wherein the signal line member has a width which is greater than a width of the black matrix in the protrusion member and a portion of an upper surface of the signal line member contacts the transparent connector.

12. The thin film transistor array panel of claim 10, wherein the protrusion member comprises at least one insulating layer.

13. The thin film transistor array panel of claim 10, wherein the transparent connector contacts a side surface of the signal line member.

14. The thin film transistor array panel of claim 1, wherein the protrusion member comprises a plurality of recessed portions and a cross-sectional area of each recessed portion is between about 4 square micrometers to about 100 square micrometers.

15. The thin film transistor array panel of claim 14, wherein a gap of the recessed portions is between about 2 micrometers to about 10 micrometers.

16. The thin film transistor array panel of claim 14, wherein a tilt angle of the recessed portion is between about 15 degrees to about 90 degrees.

17. The thin film transistor array panel of claim 16, wherein a length of an axis which is horizontal relative to the tilt angle is between about 1 micrometer to about 3 micrometers.

18. The thin film transistor array panel of claim 1, wherein the peripheral area signal line comprises:
    a storage electrode line disposed on the substrate; and
    a storage voltage supply line disposed on the storage electrode line.

* * * * *